(12) United States Patent
Kim et al.

(10) Patent No.: US 11,862,291 B2
(45) Date of Patent: Jan. 2, 2024

(54) INTEGRATED COUNTER IN MEMORY DEVICE

(71) Applicant: METACNI CO., LTD., Seoul (KR)

(72) Inventors: Young Seung Kim, Seoul (KR); Mi Hwa Lim, Yongin-si (KR); Dong Min Lim, Hwaseong-si (KR)

(*) Notice: Subject to any disclaimer, the term of this patent is extended or adjusted under 35 U.S.C. 154(b) by 0 days.

(21) Appl. No.: 17/783,118

(22) PCT Filed: Dec. 3, 2020

(86) PCT No.: PCT/KR2020/017555
§ 371 (c)(1),
(2) Date: Jun. 7, 2022

(87) PCT Pub. No.: WO2021/118163
PCT Pub. Date: Jun. 17, 2021

(65) Prior Publication Data
US 2023/0015255 A1    Jan. 19, 2023

(30) Foreign Application Priority Data

Dec. 12, 2019  (KR) .......................... 10-2019-0165515

(51) Int. Cl.
*G11C 7/22* (2006.01)
*G11C 5/05* (2006.01)
*G11C 7/10* (2006.01)

(52) U.S. Cl.
CPC ............... *G11C 7/222* (2013.01); *G11C 5/05* (2013.01); *G11C 7/1009* (2013.01); *G11C 7/1018* (2013.01); *G11C 7/1036* (2013.01)

(58) Field of Classification Search
CPC ......... G11C 7/222; G11C 5/05; G11C 7/1009; G11C 7/1018; G11C 7/1036
See application file for complete search history.

(56) References Cited

U.S. PATENT DOCUMENTS 5,835,952 A * 11/1998 Yamauchi ............... G09G 5/399
                                                711/E12.079
7,210,020 B2 * 4/2007 Blodgett ............. G06F 12/0215
                                                711/213
(Continued)

FOREIGN PATENT DOCUMENTS

JP         3748648 B2      2/2006
JP         3855002 B2     12/2006
(Continued)

OTHER PUBLICATIONS

English Specification of JP3855002B2.
(Continued)

*Primary Examiner* — Vanthu T Nguyen
(74) *Attorney, Agent, or Firm* — ANTONIO HA & U.S. PATENT, LLC

(57) ABSTRACT

A memory device according to the present invention comprises: a memory cell array in which memory cells are connected to wordlines and bitlines in a matrix form; and a control circuit for programming the memory cells or controlling a read operation, according to a start address, a burst length, a latency length, and a program or read command which are transmitted from a host, wherein the control circuit may comprise: a pulse generation unit for generating register pulses and counter pulses in synchronization with an operation clock; and a counter that sets the start address in synchronization with the register pulses, counts the number of counter pulses corresponding to the sum of the latency length and the burst length, and increases an address from the start address to the sum of the start address and the burst length.

9 Claims, 15 Drawing Sheets

(56) References Cited

U.S. PATENT DOCUMENTS

| | | | |
|---|---|---|---|
| 9,865,318 B2* | 1/2018 | Kim | G11C 7/12 |
| 2004/0236898 A1* | 11/2004 | Okumura | G11C 8/04 |
| | | | 711/167 |
| 2009/0150636 A1 | 6/2009 | Gower et al. | |

FOREIGN PATENT DOCUMENTS

| | | |
|---|---|---|
| KR | 10-2012-0098027 | 9/2012 |
| KR | 10-2015-0089157 | 8/2015 |

OTHER PUBLICATIONS

English Specification of JP3748648B2.
English Specification of 10-2015-0089157.
English Specification of 10-2012-0098027.

* cited by examiner

INTEGRATED COUNTER IN MEMORY DEVICE

CROSS-REFERENCE TO RELATED APPLICATIONS

This application is the National Stage filing under 35 U.S.C. 371 of International Application No. PCT/KR2020/017555, filed on Dec. 3, 2020, which claims the benefit of Korean Application No. 10-2019-0165515 filed on Dec. 12, 2019, the contents of which are all hereby incorporated by reference herein in their entirety.

TECHNICAL FIELD

This document relates to an integrated counter in a memory device, and more particularly, to a memory device which integrates a plurality of counters into one counter.

BACKGROUND ART

There is a trend to use a burst operation to efficiently process continuous data. The burst operation is a technique which outputs, by one address and command input, data (for example, 16 bits×128) larger than an input/output unit (for example, 16 bits) by the number of clocks corresponding to the burst length specified in synchronization with a clock signal.

In a burst read mode, all memory cells connected to a specific word line or a plurality of word lines may be selected, and their data may be sequentially sensed and sequentially output. For such the burst operation, a memory device receives a start address and a burst length (or burst bit) of a cell array, and continuously performs read operations while counting up to the burst length in synchronization with a clock using the burst counter.

Also, there is a trend to utilize latency operations to increase the speed of programming or reading memory cells. The latency technique is the technique for increasing data programming or reading speed, and accesses the memory cell array by placing data registers of multiple stages in the data flow from the memory cell to a final data pad and temporarily storing data in stages.

Since the data goes through data registers in each cycle by the number of the data registers placed between input/output circuits from the memory cell, the memory device includes a latency counter for counting latency bits corresponding to the number of the data registers which data passes from the memory cell to the input/output circuits when data is transferred.

When the burst counter and the latency counter are separately provided, as the memory cell array becomes larger, the number of data registers which data passes increases, the latency bit increases, and the burst bits that are read and written at once also increase, so the number of latency counters and burst counters increases, the amount of circuits increases, control becomes complicated and it is difficult to secure a timing margin.

In such a situation, it becomes difficult to increase the data input/output speed.

DISCLOSURE

Technical Problem

This document is in view of this situation, and an object of this document is to provide the memory device in which a burst counter, a latency counter, and an address counter are integrated.

Technical Solution

The memory device according to an embodiment of this disclosure may comprise a memory cell array in which memory cells are connected to word lines and bit lines in a matrix form, and a control circuit configured to control an operation of programming or reading the memory cells according to a start address, a burst length, a latency length and a program or reading instruction transmitted from a host, wherein the control circuit comprises a pulse generator configured to a register pulse and a counter pulse in synchronization with an operation clock, and a counter configured to set the start address in synchronization with the register pulse, count a number of counter pulses corresponding to a sum of the latency length and the burst length, and increase an address from the start address to a sum of start address and the burst length.

Advantageous Effects

By combining and implementing the burst counter, latency counter, and address counter as one counter in a memory device, it is possible to simplify a circuit and counter control is facilitated, thereby increasing the data input/output speed and securing stable performance of the memory device.

BEST MODE

Figure 1:
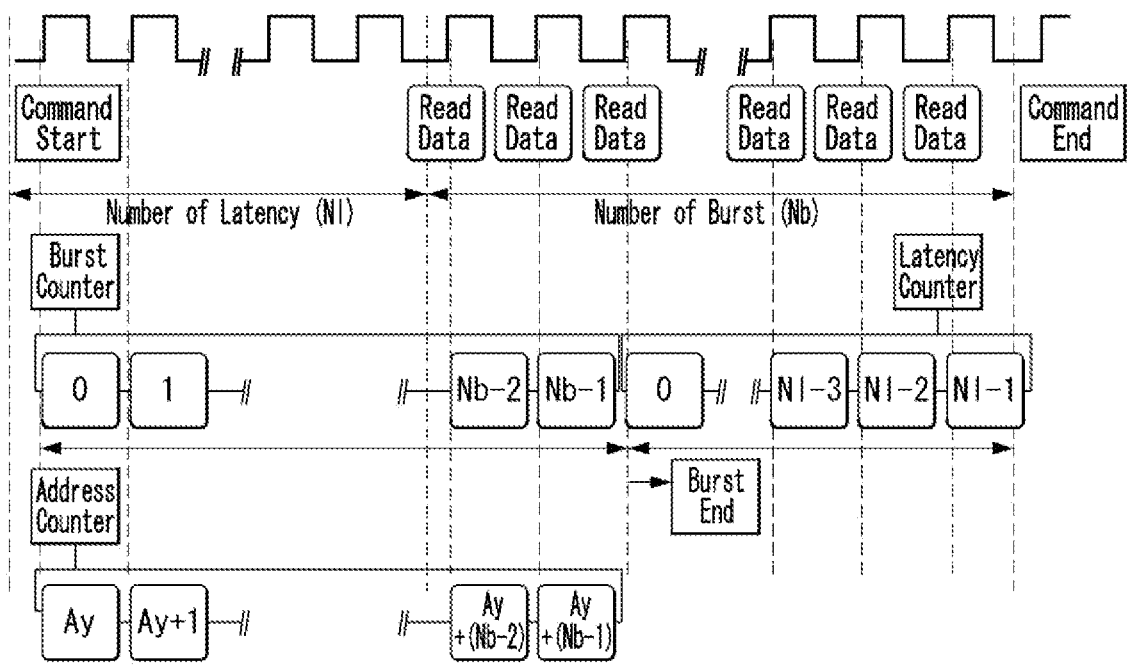
FIG. 1 schematically shows the operation timing of reading data using a burst counter, a latency counter, and an address counter.

Various embodiments of the memory device of this disclosure will be simply and clearly described as follows.

The memory device of this disclosure may comprise a memory cell array in which memory cells are connected to word lines and bit lines in a matrix form, and a control circuit configured to control an operation of programming or reading the memory cells according to a start address, a burst length, a latency length and a program or reading instruction transmitted from a host, wherein the control circuit comprises a pulse generator configured to a register pulse and a counter pulse in synchronization with an operation clock, and a counter configured to set the start address in synchronization with the register pulse, count a number of counter pulses corresponding to a sum of the latency length and the burst length, and increase an address from the start address to a sum of start address and the burst length.

In an embodiment, the counter may be configured to increase a count value until the burst length, then reset the count value, and increase the count value until the latency length again.

In an embodiment, the pulse generator may be configured to generate the register pulse in synchronization with a rising edge of the operation clock, and generate the counter pulse in synchronization with a falling edge of the operation clock.

In an embodiment, the counter may comprise a number of bit counters corresponding to a number of bits constituting the address, and a mask generator configured to compare the count values output from the bit counters with the burst length and the latency length for each counter pulse, and generate a mask signal which resets the bit counters when the count values matches the burst length or the latency length.

In an embodiment, each bit counter may be configured to toggle an internal count value whenever a number of counter pulses corresponding to a corresponding bit position are input, generate a value of the corresponding bit position of the address and a carry output signal based on the internal count value of a corresponding bit counter, a value of the corresponding bit position of the start address stored in the corresponding bit counter, a carry signal transmitted from a bit counter of a lower bit position, and initialize the internal count value responding to the mask signal.

In an embodiment, the mask generator may be configured to generate the mask signal to output to the bit counters when the count value becomes the burst length, and then generate the mask signal to output to the bit counters when the count value becomes the latency length.

In an embodiment, the bit counter may comprise a sum signal generator configured to output a sum signal of a corresponding bit by performing AND logic processing on a sum signal output by the bit counter of a lower bit and an internal count value, a pulse filter configured to generate an internal counter pulse synchronized with the counter pulse on condition that the sum signal output by the sum signal generator is logic high, a shift register configured to output the internal count value by toggling the internal count value in synchronization with the internal counter pulse and reset the internal count value responding to the mask signal, a register configured to store a value of a corresponding bit of the start address in synchronization with the register pulse and output the stored value as a register value, and an adder configured to generate the carry output signal and an address output signal by using the internal count value, the register value, and the carry signal output by the bit counter of the lower bit.

In an embodiment, the pulse filter may be configured to output a pulse equal to the counter pulse as the internal counter pulse when a rising edge occurs on the counter pulse while the sum signal is logic high, and output logic low when a rising edge occurs on the counter pulse while the sum signal is logic low.

In an embodiment, the shift register may be configured to reset the internal count value according to the mask signal when the internal counter pulse coincides with the mask signal.

In an embodiment, the adder may be configured to generate the address output signal as logic high when only one of the internal count value, the register value and the carry signal output by the bit counter of the lower bit is logic high or all of them are logic high, and output the carry output signal as logic high when two or more of the internal count value, the register value and the carry signal output by the bit counter of the lower bit are logic high.

In an embodiment, the adder may comprise an address generator including a first XOR gate performing XOR logic processing on two of the internal count value, the register value and the carry signal output by the bit counter of the lower bit and a second XOR gate performing XOR logic processing on a remainder of the internal count value, the register value and the carry signal output by the bit counter of the lower bit and an output of the first XOR gate, and a carry generator including first, second and third NAND gates each of which performs NAND logic processing on one of three combinations each of which comprises two of the internal count value, the register value and the carry signal output by the bit counter of the lower bit, and a fourth NAND gate performing NAND logic processing on outputs of the first, second and third NAND gates.

MODE FOR INVENTION

Hereinafter, preferred embodiments of the memory device and the method of driving a memory according to this disclosure will be described in detail with reference to the accompanying drawings.

FIG. 1 schematically shows the operation timing of reading data using a burst counter, a latency counter, and an address counter.

In order to count clocks from the beginning to the end of the read command, that is, until the data read from the memory cell is output, a burst counter, latency counter, and address counter work.

From the start to the end of the command, it takes time for the number of clock pulses to be input corresponding to the sum of a latency number Nl and the burst number Nb. Here, the latency number Nl corresponds to the number of data registers which data passes from the memory cell to the input/output circuit, and the burst number Nb corresponds to the number of data requested to be read or written from the host.

As shown in FIG. 1, when a command is first input (Command Start), the burst counter operates in synchronization with the clock to count the clock, and the count is stopped (Burst End) when the count value reaches the burst number Nb. Afterwards, the latency counter counts the clock in synchronization with the clock, and the count stops and the command ends (Command End) when the count value reaches the latency number Nl.

The address counter starts from the start address input at the start of the command and increments the address according to the burst counter until the burst counter stops counting.

After the start of the command, the actual data reading (Read Data) starts after the clock pulse progresses as much as the latency number Nl, reading data continues while the clock pulse progresses as much as the burst number Nb, and the data reading is terminated when the clock pulse advances as much as the sum of the latency number Nl and the burst number Nb.

Figure 2A:
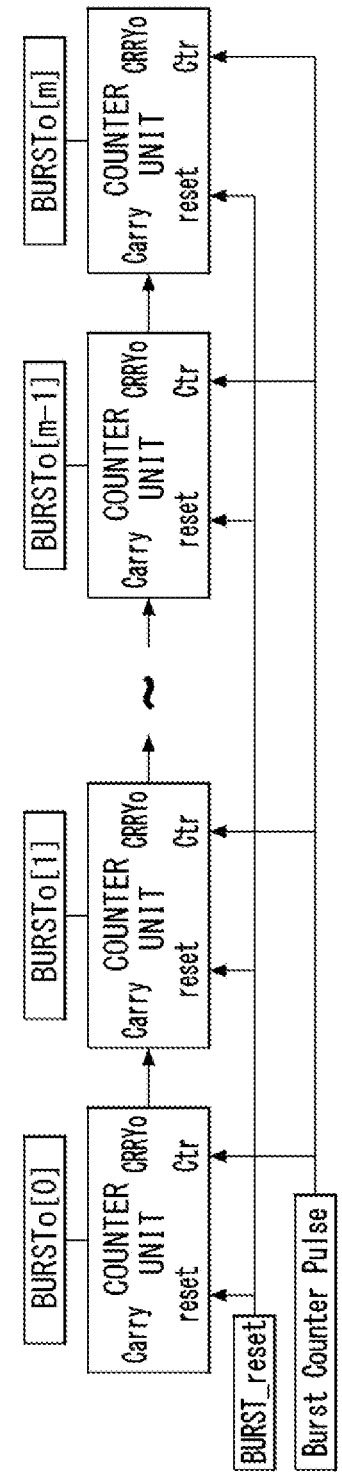
FIGS. 2A to 2C show the configuration of a burst counter, a latency counter, and an address counter, respectively.
Figure 2B:
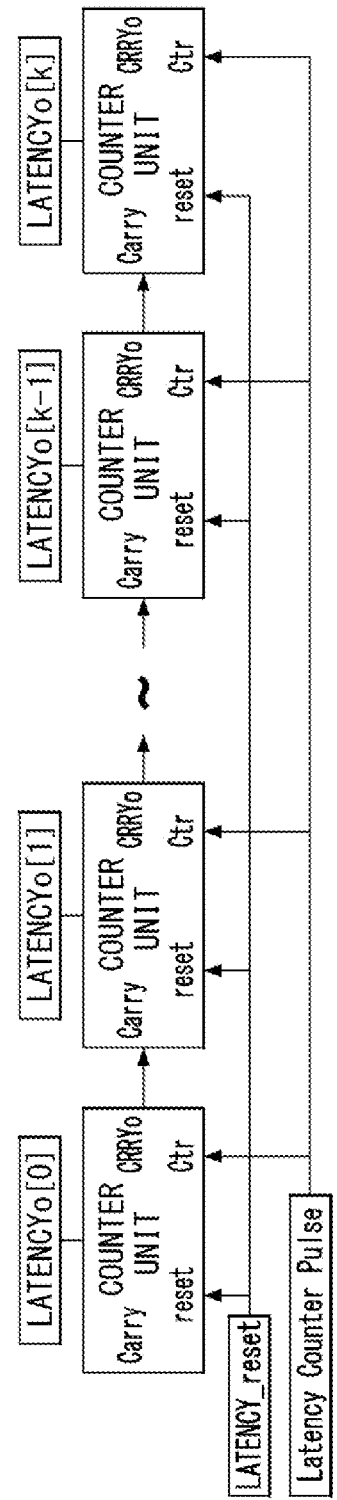
Figure 2C:
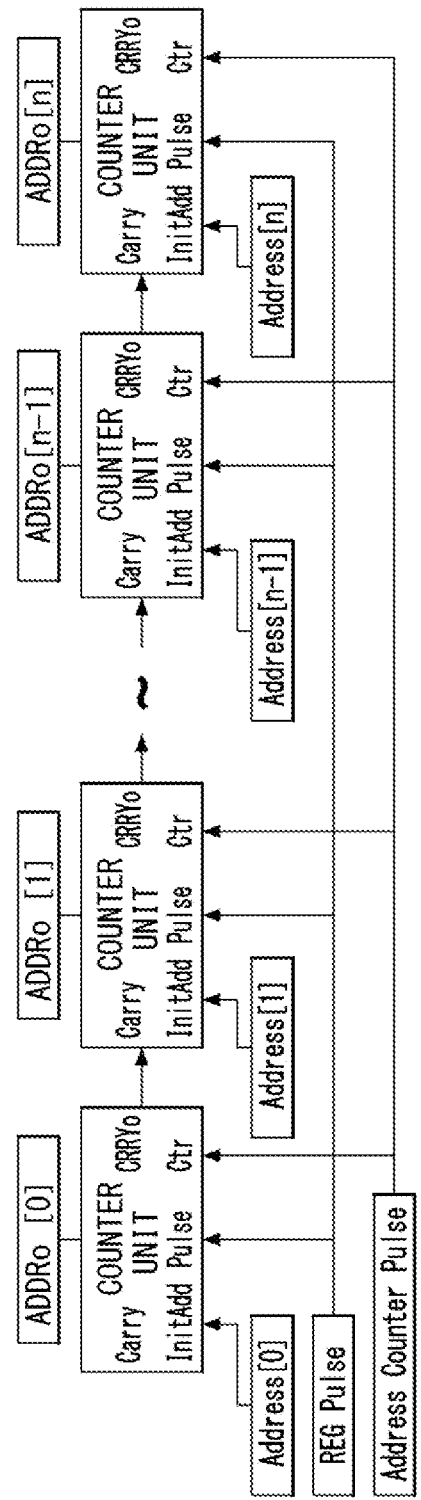

FIGS. 2A to 2C show the configuration of a burst counter, a latency counter, and an address counter, respectively.

As shown in FIG. 2, the burst counter may consist of (m+1) bit counters (COUNTER UNIT) from 0 bits to m bits, the latency counter may consist of (k+1) bit counters (COUNTER UNIT) from 0 bits to k bits, and the address counter may consist of (n+1) bit counters (COUNTER UNIT) from 0 bits to n bits.

The burst counter and latency counter differ only in the number of bit counters, and the operation of each bit counter is the same.

The bit counter (COUNTER UNIT) constituting the burst counter has, as input terminals, a reset terminal that receives a burst reset signal BURST_reset, and a control terminal Ctr that receives a clock, that is, a burst counter pulse, and a carry input terminal that receives a carry signal from a lower bit counter, and has an output terminal that outputs an internal value as a burst output BURSTo and a carry output terminal CRRYo that outputs a carry signal to a upper bit counter as output terminals.

The bit counter (COUNTER UNIT) of the burst counter resets an internal value to 0 according to the burst reset signal BURST_reset, increases the internal value by 1 according to a rising edge (or falling edge) of the burst counter pulse or the carry signal of a lower bit counter, and outputs the internal value to the burst output BURSTo through the output terminal according to the burst counter pulse.

In addition, the bit counter of the burst counter generates a carry signal when the internal value changes from 1 to 0 and outputs it to the bit counter of upper bit through the carry output terminal CRRYo.

Among the (m+1) bit counters (COUNTER UNIT) of the burst counter, the bit counter of $0^{th}$ bit position does not receive a carry signal and changes the internal value according to the burst counter pulse, and the bit counters of the remaining bit positions increase the internal values according to the carry signal of the lower bit counter, not the burst counter pulse.

Similarly, the bit counter constituting the latency counter has, as input terminals, the reset terminal that receives a latency reset signal (LATENCY_reset), the control terminal Ctr receives the latency counter pulse, and a carry input terminal that receives a carry signal from a lower bit counter, and has, as output terminals, an output terminal that outputs an internal value as a latency output LATENCYo and a carry output terminal CRRYo that outputs a carry signal to a upper bit counter.

The operation of the bit counter constituting the latency counter is the same as the operation of the bit counter of the burst counter.

The bit counter constituting the address counter has, as input terminals, an initial address terminal InitAdd for receiving a start address, an address registration pulse terminal (AddReg Pulse) for receiving a registration pulse (REG Pulse) for registering the start address, and an address counter The control (Ctr) terminal that receives the address counter pulse and the carry input terminal (Carry) for receiving a carry signal from a lower bit counter, and has, as output terminals, an output terminal for outputting an internal value as an address output ADDRo and a carry output terminal CRRYo for outputting a carry signal to an upper bit counter.

The bit counter constituting the address counter sets the value of the start address input through the initial address terminal InitAdd as an internal value according to the registration pulse (REG Pulse), increments the internal value by 1 according to the address count pulse or the carry signal of the lower bit counter, and outputs the internal value as an address output ADDRo through the output terminal according to the address counter pulse.

In addition, the bit counter of the address counter generates a carry signal when the internal value changes from 1 to 0 and outputs it to the bit counter of an upper bit through the carry output terminal CRRYo.

The burst, latency, and address counter clocks are the pulses generated in synchronization with an operation clock.

Figure 3:
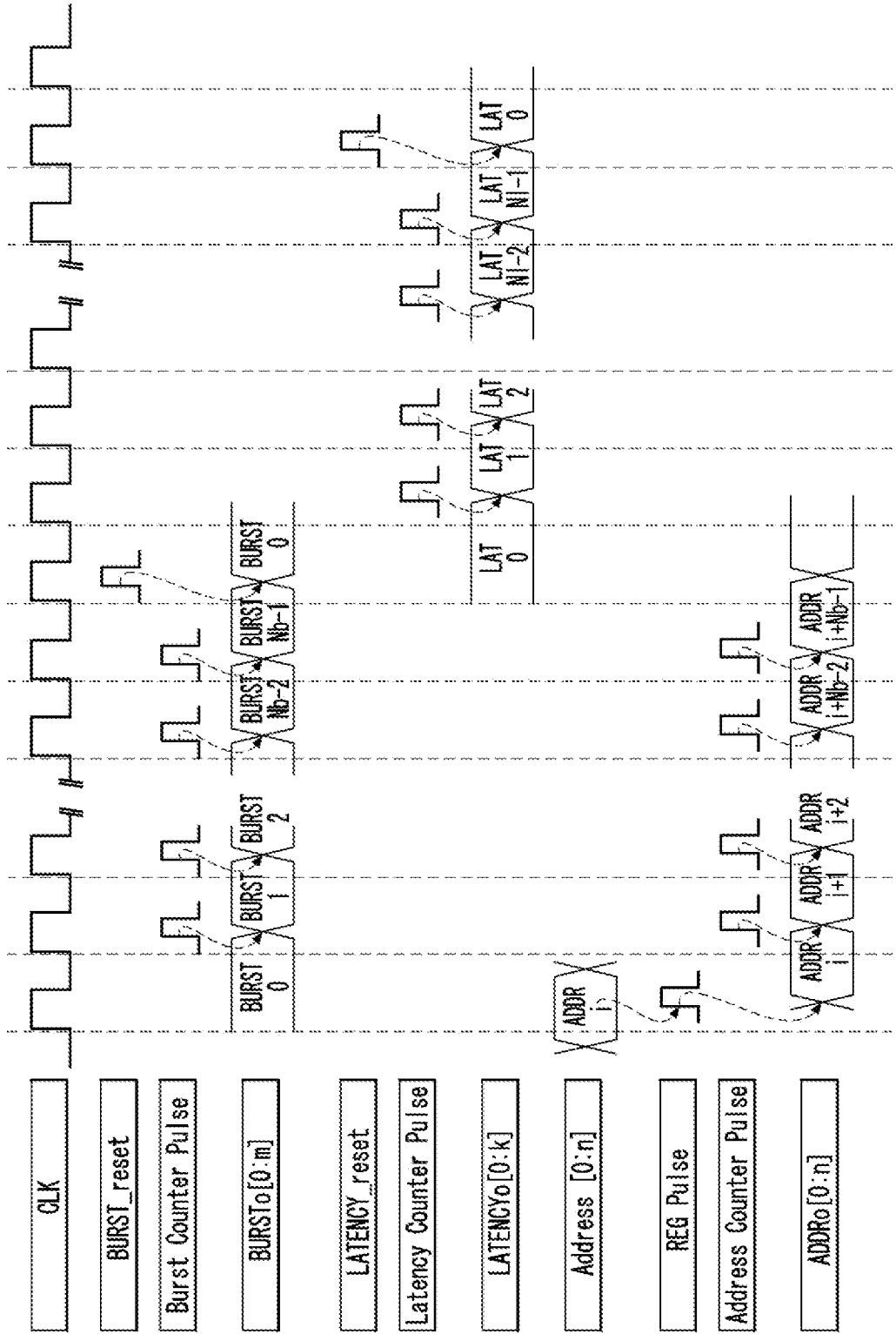
FIG. 3 shows the timing diagram of accessing data using each counter of FIGS. 2A to 2C.

FIG. 3 shows the timing diagram of accessing data using each counter of FIGS. 2A to 2C.

When a command is started, the start address from which data is to be read or written is first written to the address counter. When the start address (ADDR i) is supplied from a host, each bit counter of the address counter sets the value of the corresponding bit of the start address (ADDR i) as an internal value according to the registration pulse (REG Pulse).

Each bit counter of the address counter and burst counter increases the address and a burst count value in synchronization with the burst counter pulse and the address counter pulse generated in synchronization with the operation clock CLK.

The burst output value BURSTo output from the burst counter is compared with the burst length (or burst bit) Nb of data requested to read or write by the host. When the burst output value reaches the burst bit Nb, a burst reset (BURST_reset) is generated, the burst counter is reset, and the operation of the address counter is stopped.

Burst reset BURST_reset is triggered to output a latency counter pulse, and each bit counter of the latency counter increases the latency count value in synchronization with the latency counter pulse.

The latency output value LATENCYo output by the latency counter is compared with the latency bit Nl. When the latency output value reaches the latency bit Nl, a latency reset (LATENCY_reset) is generated, the latency counter is reset, and the command requested by the host is terminated.

In the configuration described with reference to FIGS. 1 to 3, in order to perform a data program or data read operation in a burst mode, the burst counter, the latency counter, and the address counter must be separately employed. So, the size of the memory controller accommodating these counters increases, power consumption increases, and control is complicated.

To solve this problem, this document discloses an embodiment in which a burst counter, a latency counter, and an address counter are integrated into one counter.

Figure 4:
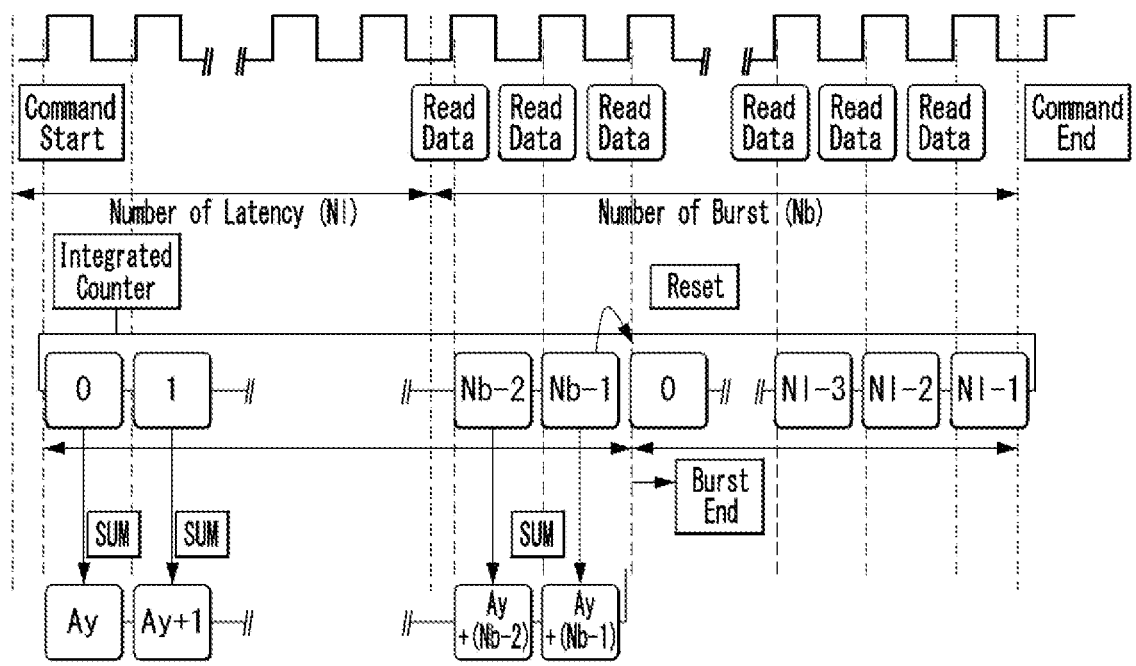
FIG. 4 shows the schematic operation timing of the integrated counter in which the burst counter, the latency counter and the address counter are integrated, FIG. 5 schematically shows the functional block of a memory device.

FIG. 4 shows the schematic operation timing of the integrated counter in which the burst counter, the latency counter and the address counter are integrated.

One integrated counter counts a clock from the beginning to the end of a command. The integrated counter counts the clock (or counter pulse generated in synchronization with the clock) by the burst bit Nb, then resets the count value (Burst End), counts the counter pulse again, and resets it again to terminate the command if the count value becomes the latency bit Nl.

While counting up to the burst bit Nb, the integrated counter adds the count value to the start address input when the command starts to increment the address until the burst count ends (Burst End). If the starting address is Ay, the last address becomes (Ay+(Nb−1)).

That is, the integrated counter stores a current address and adds the count value to the current address through an adder to generate a next address, so the adder acts as an address counter.

The actual output of data through the data input/output circuit according to the data read operation (Read Data) starts when the count value of the integrated counter becomes the latency bit Nl, proceeds until the number of counter pulses input thereafter becomes the burst bit Nb, and then ends.

Figure 5:
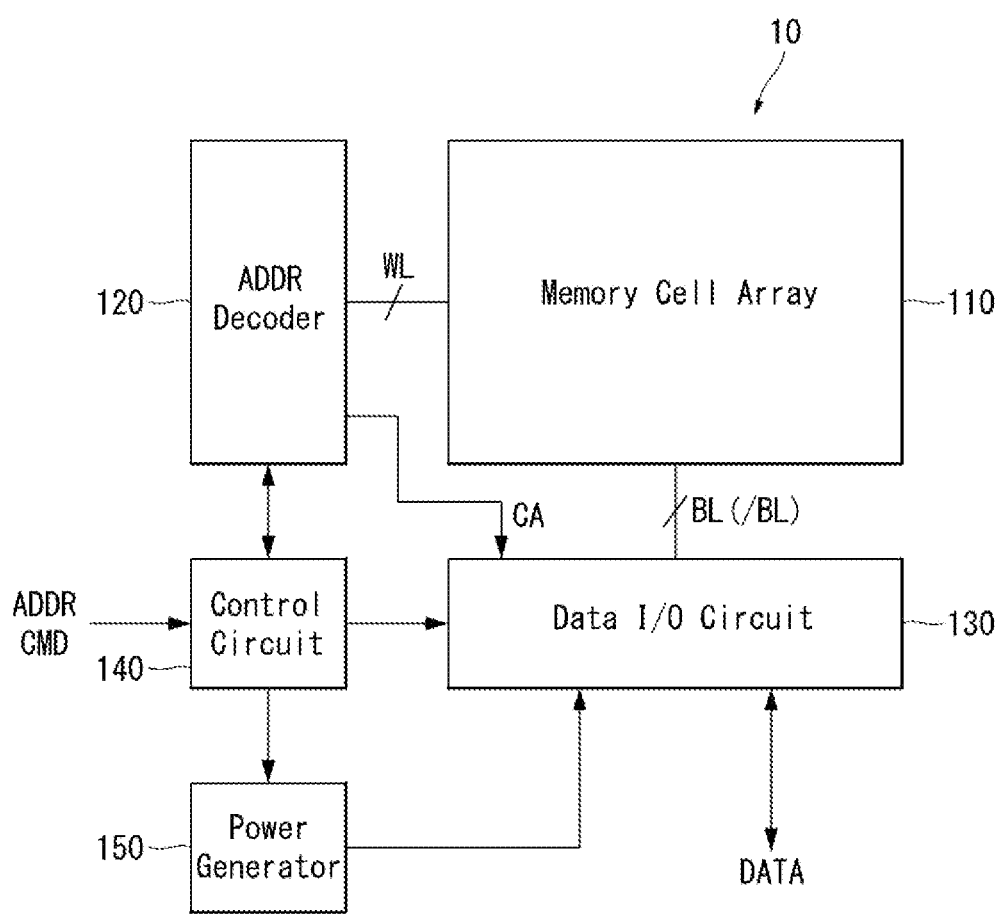

FIG. 5 schematically shows the functional block of a memory device

The memory device 10 may comprise a memory cell array 110 composed of, for example SRAM memory cells and a driving circuit configured to drive the memory cell array 110. The driving circuit may include an address decoder 120, an input/output circuit 130, a control circuit 140, and a power generator 150.

The address decoder 120 is configured to decode an address ADDR, to be connected to the memory cell array 110 through word lines WL, and to drive the word lines WL under the control of the control circuit 140.

The address decoder 120 decodes the address ADDR received through the control circuit 140 to obtain a row address and a column address CA and selects a word line WL to be driven based on the row address, and provides the column address CA indicating a bit line BL/BL to the input/output circuit 130 and/or the control circuit 140 so that the input/output circuit 130 can select a corresponding bit line.

The input/output circuit 130 receives or outputs data DATA to be written or read to/from the memory cell array 110, connects the bit line BL/BL selected by the column address provided by the address decoder 120 to the memory cell array 110, and performs the operation of writing or reading data to/from the memory cell array 110 under the control of the control circuit 140.

The input/output circuit 130 may comprise the data read circuit including the sense amplifier that detects and amplifies the data bit charged to the bit line, the data write circuit for charging the bit line with the data bits to be written to the memory cell, and the circuit configuration for equalizing and precharging the bit line BL/BL.

The control circuit 140 is connected to the address decoder 120, the input/output circuit 130, and the power generator 150, and is configured to control the operation of the memory device 10, that is the operation of writing or reading data to/from the memory cell array 110.

The power generation unit 150 is configured to generate a plurality of voltages necessary for the operations of the memory cell array 110, the address decoder 120, the input/output circuit 130 and the control circuit 140 by using an external voltage supplied to the memory device 10. The power generation unit 150 generates and supplies a power voltage, a precharging voltage, word line on/off voltages, and the like.

The control circuit 140 receives the read or write command CMD including a start address ADDR, burst length information (or requested data amount information) and latency length information from a host (not shown).

In addition, the control circuit 140 includes the integrated counter in which the burst counter, the latency counter, and the address counter are integrated into one. By using this, the control circuit 140 counts the number of clocks (or counter pulses) corresponding to the sum of the burst length and the latency length, and writes data to or reads data from the memory cell of the corresponding address while changing the address to be accessed from the start address.

Also, the control circuit 140 may include the pulse generator for generating the control pulse necessary for the operation of the integrated counter. The pulse generator may generate the counter pulse used by the integrated counter to increment the count value in synchronization with the operating clock of a system, and generate the register pulse necessary to set a start address to the integrated counter in synchronization with the operating clock.

Figure 6:
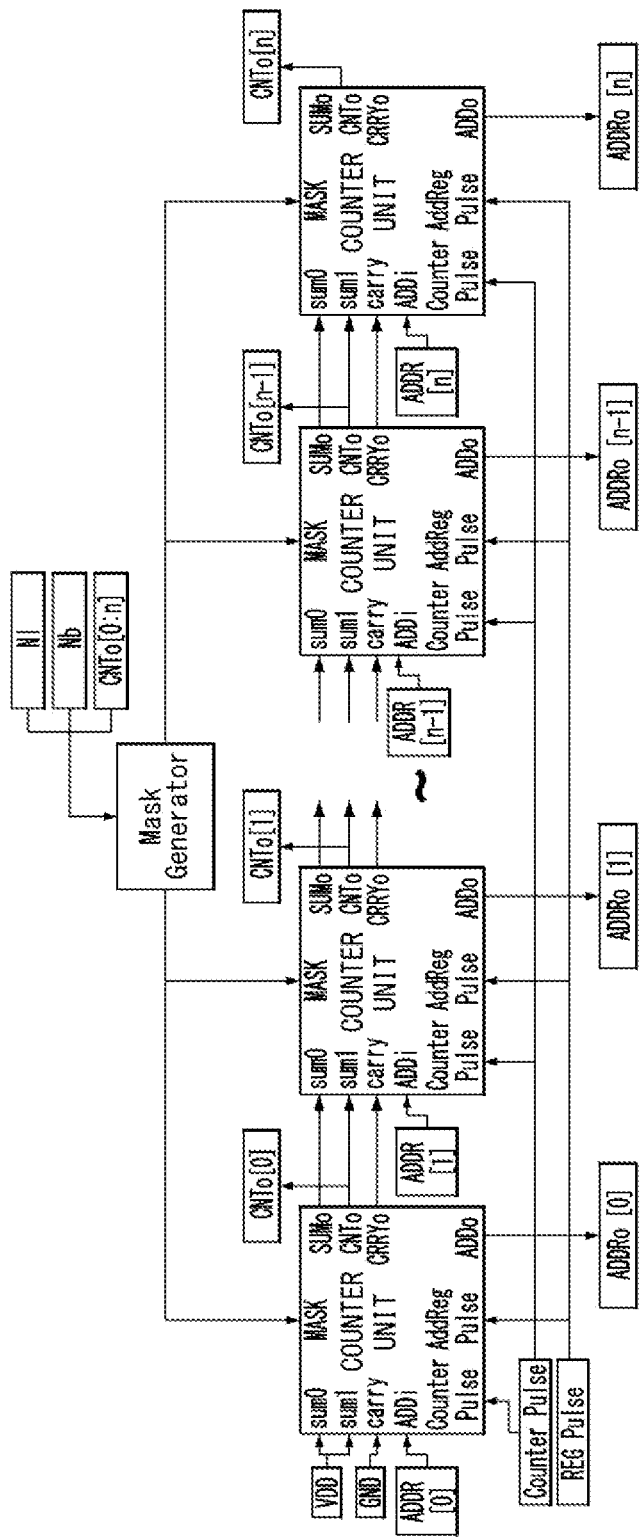
FIG. 6 shows the specific configuration of the integrated counter.

FIG. 6 shows the specific configuration of the integrated counter.

The integrated counter includes a bit counter (COUNTER UNIT) and a mask generator as many as the number of bits constituting the address. In the example of FIG. 6, there are (n+1) bit counters from $0^{th}$ bit to $n^{th}$ bit.

Each bit counter (COUNTER UNIT) may include, as input terminals, an address input terminal ADDi, a counter pulse terminal (Counter Pulse), an address register pulse terminal (AddReg Pulse), a carry input terminal (Carry), two sum input terminals (sum0, sum1) and a mask terminal MASK.

Also, each bit counter (COUNTER UNIT) may include, as output terminals, a sum output terminal SUMo, a count value terminal CNTo, a carry output terminal CRRYo, and an address output terminal ADDo.

To the address input terminal ADDi, a corresponding bit of the start address ADDR is input.

A counter pulse is input to the counter pulse terminal. When the counter pulse is input, it is input to the bit counter of the lowest bit, and the count value of the corresponding bit is changed (toggled), and each bit counter outputs a count value through the count value terminal CNTo.

The register pulse (REG Pulse) input to the address register pulse terminal (AddReg Pulse) stores the bit of the start address ADDR input to the address input terminal Addi in an internal register and sets it as an internal address value.

The carry signal input to the carry terminal is involved only in address calculation, and the address output ADDo and the carry output CRRYo of a corresponding bit counter are determined by the carry signal, the internal address value, and the count value.

The bit counter of an upper bit should not increment a count value every counter pulse. The signal for generating the internal counter pulse required for the corresponding bit counter for every number of counter pulses corresponding to a corresponding bit position is input to the sum input terminals (sum0, sum1).

For example, the bit counter of $1^{st}$ bit position may generate an internal counter pulse whenever two counter pulses of $2^1$ are input, and the bit counter of $2^{nd}$ bit position may generate an internal counter pulse whenever 4 counter pulses of $2^2$ are input.

In the bit counter of the first bit, that is, the least significant bit, VDD or logic high is input to both sum input terminals (sum0, sum1). In the bit counter of subsequent bits, the sum output signal SUMo of a previous bit counter is input to the sum0 terminal, and the count value CNTo of the previous bit counter is input to the sum1 terminal.

The output of the mask generator is supplied to the mask terminal MASK to initialize the internal count value and internal address of each bit counter.

The sum output terminal outputs the result of AND logic processing of the two sum input signals (sum0, sum1) as the sum output SUMo.

The count value terminal outputs the count value (CNTo) of a corresponding bit counter. An internal counter pulse is generated and the count value CNTo is toggled whenever the number of counter pulses corresponding to the bit position of a corresponding bit counter are input.

The carry output terminal CRRYo outputs the carry signal generated based on the carry input output from a previous bit counter, the count value CNTo and an internal address value. The carry signal is generated as logic high when two or more of the carry input, the count value CNTo and the internal address value are 1, and is generated as logic low in the other case.

The mask generating unit receives the burst length Nb and latency length Nl information when a command starts, and receives count values (CNTo[0:n]) outputted by (n+1) bit counters for each operation clock or each counter pulse.

The mask generator compares the count value (CNTo[0:n]) output by the bit counter with the burst length Nb for each counter pulse, and outputs the mask signal of logic high to each bit counter to initialize the count value CNTo of each bit counter to 0 if they match. Thereafter, the mask generator compares the count value (CNTo[0:n]) output by the bit counter with the latency length Nl for each counter pulse, and outputs the mask signal of logic high to each bit counter to initialize the count value CNTo of each bit counter to 0 if they match.

Figure 7:
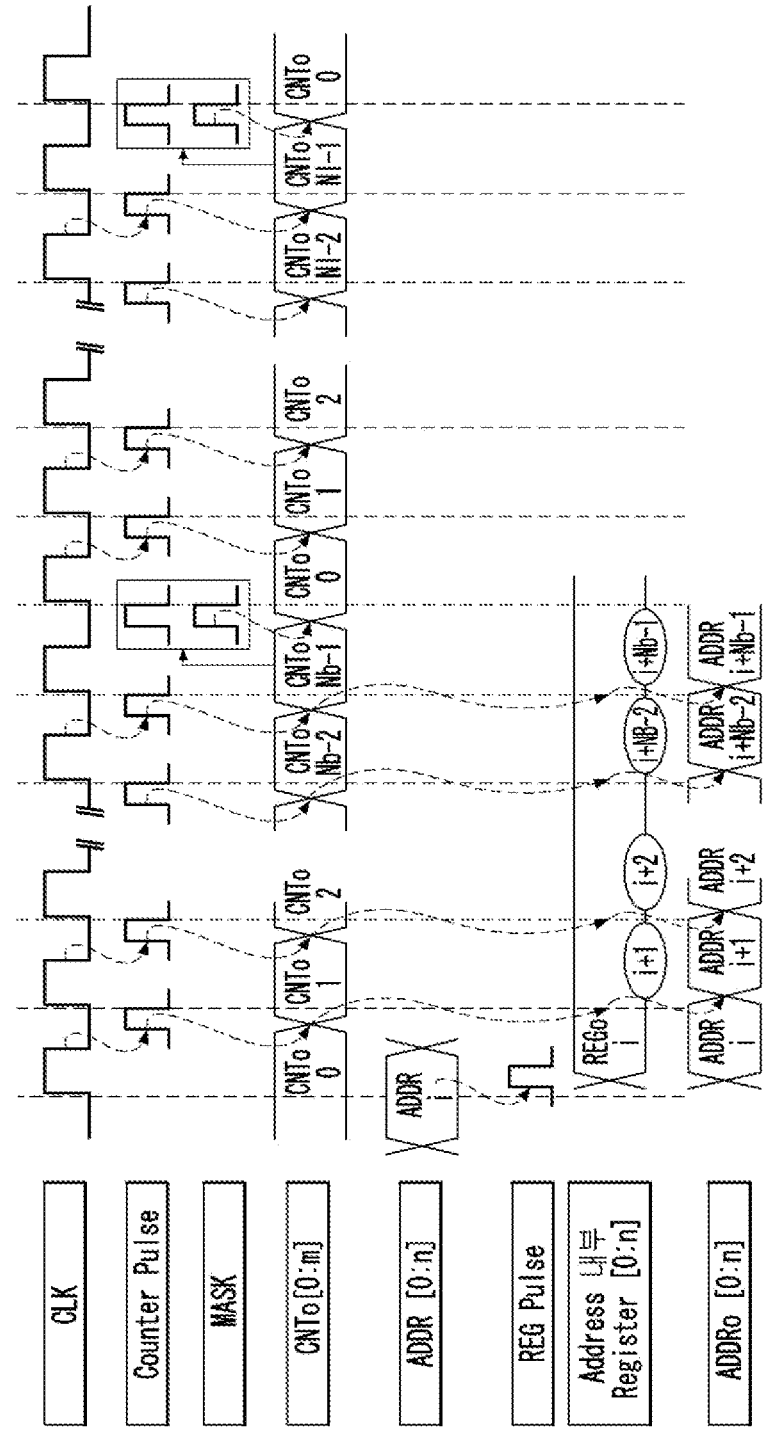
FIG. 7 shows the timing diagram of accessing data using the integrated counter of FIG. 6.

FIG. 7 shows the timing diagram of accessing data using the integrated counter of FIG. 6.

The counter pulse may be generated in synchronization with the operation clock CLK. For example, the rising edge of the counter pulse which has a predetermined length starts in synchronization with the falling edge of the operation clock CLK.

In order to set a start address for each bit counter, the register pulse (REG Pulse) is generated in synchronization with the operation clock CLK prior to generation of the counter pulse. The rising edge of the register pulse which has a predetermined length may start in synchronization with the rising edge of the operation clock CLK.

Each bit counter stores the start address ADDR input to the address input terminal ADDi in an internal register in synchronization with the register pulse (REG pulse). The bit of the start address ADDR stored in the internal register does not change even if the counter pulse is supplied. The counting operation of each bit counter is performed after the setting of the start address.

The mask generator receives the burst length information Nb and latency length information Nl included in the command.

The integrated counter increases a total count value while toggling the internal count value CNTo sequentially from the bit counter of the lowest bit position when the counter pulse is input. The bit counter of the lowest bit digit toggles the internal count value for each counter pulse, and the bit counter of a upper bit digit toggles the internal count value whenever the number of counter pulses corresponding to the bit digit are input.

And, each bit counter outputs the address output ADDRo based on the internal count value CNTo of the corresponding bit counter, the bit of the start address stored in the internal register, and the carry signal transmitted from the bit counter of a lower bit digit. So, the total address output ADDRo outputted by each bit counter increases by one for each counter pulse.

The mask generating unit compares the total count value CNTo[0:n] with the burst length Nb for each counter pulse, and generates the mask signal to reset the internal count value of each bit counter to 0 when the total count value CNTo[0:n] reaches the burst length Nb.

When the total count value CNTo[0:n] reaches the burst length Nb and the mask signal is generated, the bit counter no longer needs to generate the address output ADDRo.

After that, each bit counter increases the total count value while toggling the internal count value CNTo sequentially from the bit counter of the lowest bit digit when the counter pulse is input. When the total count value reaches the latency length Nl, the mask generator generates the mask signal to initialize the bit counters, and the command ends.

Figure 8:
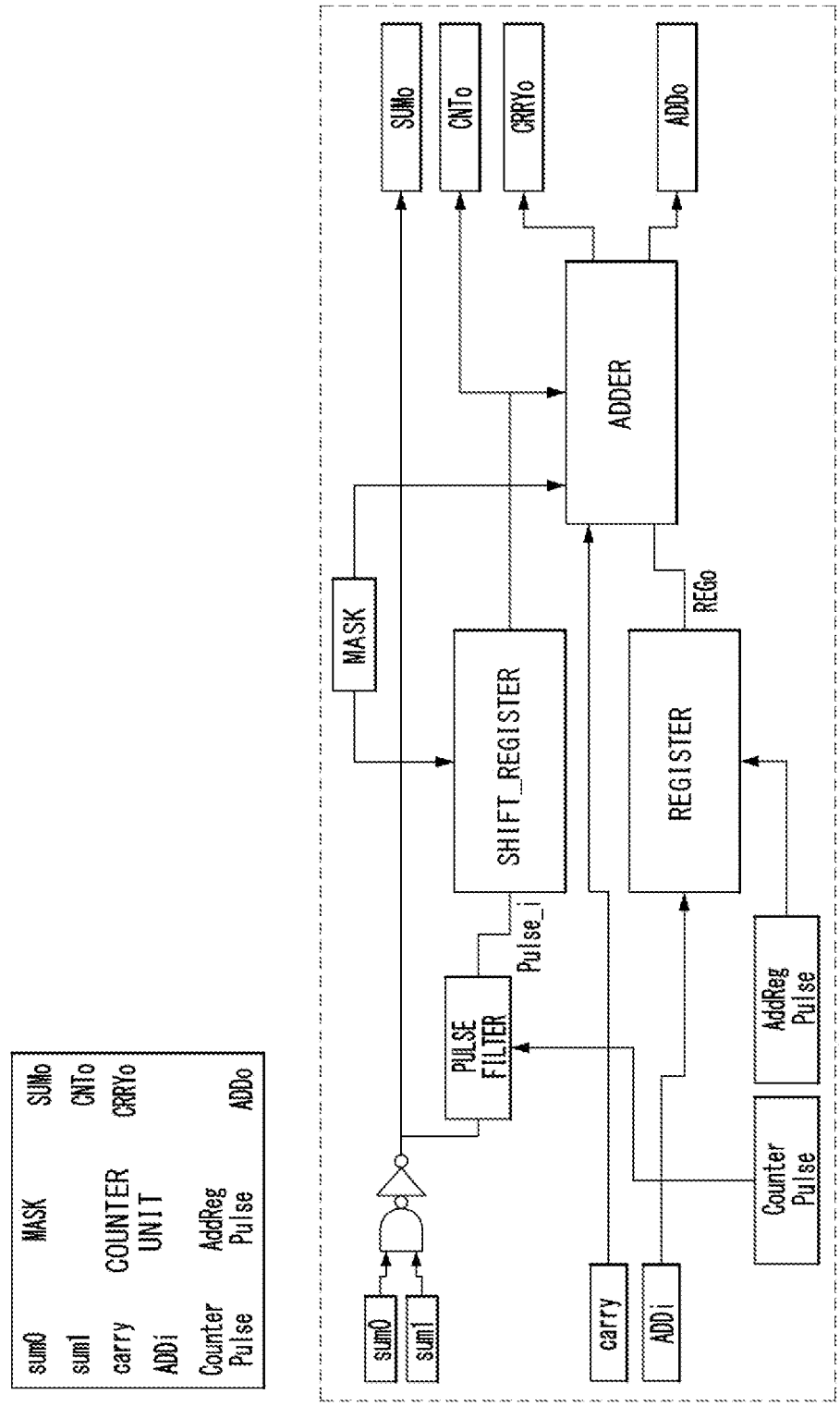
FIG. 8 shows the detailed configuration of each bit counter constituting the integrated counter of FIG. 6, FIG. 9A to 9C show the specific configuration and operation of the pulse filter constituting the bit counter of FIG. 8, FIGS. 10A and 10B show the specific configuration and operation of the shift register constituting the bit counter of FIG. 8, FIGS. 11A and 11B show the specific configuration and operation of the register constituting the bit counter of FIG. 8.

FIG. 8 shows the detailed configuration of each bit counter constituting the integrated counter of FIG. 6.

As shown in FIG. 8, the bit counter of each bit digit may comprise the summation signal generator that generates the summation output signal SUMo, a pulse filter (PULSE FILTER), a shift register (SHIFT REGISTER), a register REGISTER, and an adder ADDER.

The sum signal generating unit performs AND logic processing on the sum input signals of the two sum signal input terminals (sum0, sum1) to generate the sum output signal SUMo of logic high only when the sum input signals are logic high, and may comprise a NAND gate and a NOT gate connected in series.

The pulse filter receives the sum output signal SUMo of the sum signal generator and the counter pulse as inputs, and generates an internal counter pulse that synchronizes in the counter pulse under the logic high of the sum output signal SUMo.

In other words, when the sum output signal SUMo is logic high at the rising edge of the the counter pulse, the pulse filter produces the internal counter pulse having the same timing as the counter pulse, and when the sum output signal SUMo is logic low at the rising edge of the he counter pulse, the pulse filter ignores the counter pulse and outputs logic low.

The shift register toggles the internal count value according to the inner counter pulse, the output of the pulse filter, to output as a count output signal CNTo, and resets the internal count value in response to a mask signal.

The register stores, to an inner register, the bits of the start address ADDR supplied through the start address terminal ADDi in synchronization with the register pulse input through the address register pulse terminal AddRegPulse, and output it as an register output REGo.

The adder receives the count output CNTo of the shift register, the register output REGo of the register, and the carry signal input through a carri signal input terminal as inputs, and generates a carry output signal CRRYo and an address output signal ADDo. Also, the adder initializes the address output signal ADDo according to the mask signal.

Figure 9A:
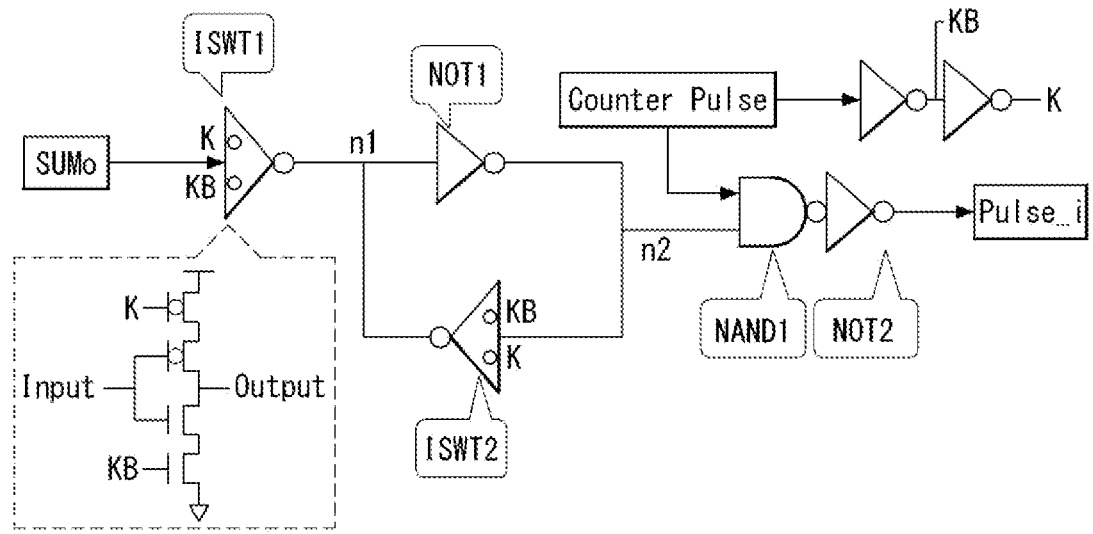
Figure 9B:
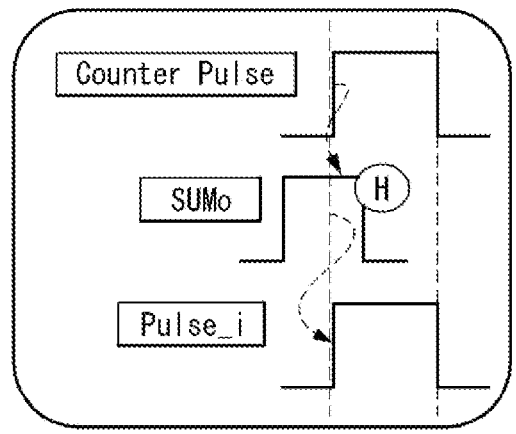
Figure 9C:
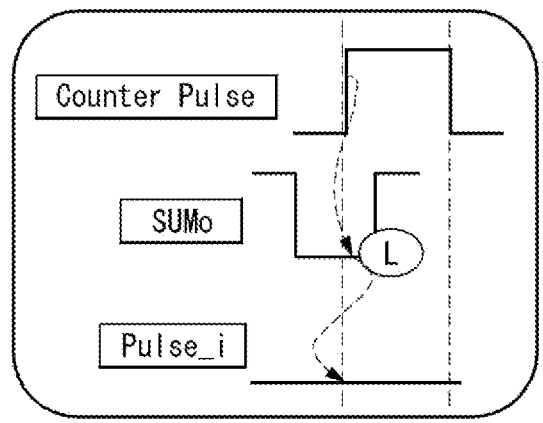

FIG. 9A to 9C show the specific configuration and operation of the pulse filter constituting the bit counter of FIG. 8.

The pulse filter performs the function that outputs or does not output the counter pulse according to the condition of the sum output SUMo, so outputs a synchronized pulse with the counter pulse as an internal pulse signal Pulse_i or outputs the internal pulse signal Pulse_i as logic low.

The input counter pulse goes through one or two of two NOT gates to become a K signal of the same phase and a KB signal of a reverse phase.

The pulse filter may comprise the first inversion switch ISWT1 which determines by the K and KB signals whether to output the sum output SUMO which is an input, the the first NOT gate NOT1 and the second inversion switch ISWT2 which are connected in parallel while inputs and outputs are connected to each other to latch the output of the first inversion switch ISWT1, the first NAND gate NAND 1 which receives the outer pulse and the output of the first NOT gate NOT1, and the second NOT gate NOT2 which outputs the internal pulse Pulse_i by inverting the output of the first NAND gate NAND 1.

In FIG. 9A, the inversion switch ISWT uses two opposite phased control signals to invert an input to output the inverted input or separate the input and output from each other, which may be called as a mux or a breaker.

In the inversion switch (ISWT) in FIG. 9A, two P-type transistors and two N-type transistors from a high potential power source to the ground are connected in series, a first control signal is connected to the gate of the P-type transistor, a second control signal is connected to the gate of the N-type transistor, one input is connected to the gates of the P-type transistor and the N-type transistor respectively, and the output is formed at the connection part of the P-type transistor and the N-type transistor.

The first and second control signals of the first inversion switch ISWT1 are respectively K and KB, and the first and second control signals of the second inversion switch ISWT2 are respectively KB and K.

The control signals K and KB are respectively logic low and logic high, when the counter pulse is logic low in state in which the sum output SUMo which is the input of the pulse filter is logic high.

At this time, the first node n1, which is the output of the first inversion switch ISWT1, becomes logic low by the first inversion switch ISWT1 the second node n2, which is the output terminal of the first NOT gate NOT1, becomes logic high, and the second inversion switch ISWT2 is turned off, does not connect the input and the output with inversion, and play a role of blocking the input, so does not change the state of the first node n1. Also, since the counter pulse, which is the input of the first NAND gate NAND1, is logic low, the output of the first NAND gate NAND1 is logic high and accordingly, the internal pulse Pulse_i, which is the output of the second NOT gate NOT2, becomes logic low.

If the counter pulse changes from logic low to logic high at a rising edge in state in which the sum output SUMo, which is the input of the pulse filter, is logic high, the control signals K and KB respectively becomes logic high and logic low.

At this time, the first inversion switch ISWT1 is turned off and does not connect the input and the output, so the first and second nodes n1 and n2 respectively maintain logic low and logic high which are their previous states. The second inversion switch ISWT2 is turned on to connect the input and the output with inversion, so maintains (or latches) the states of the first and second nodes n1 and n2 as they are. Also, since the counter pulse, which is the input of the first NAND gate NAND1, is logic high, the first NAND gate NAND1 reverses the second node n2, which is the input, to output logic low, and accordingly, the inner pulse Pulse_i, which is the output of the second NOT gate NOT2, becomes logic high.

Even though the sum output SUMo changes from logic high to logic low in state that the counter pulse is logic high, the first inversion switch ISWT1 is turned off and the states of the nodes after the first node n1 are not changed. So the internal pulse Pulse_i, which is the output of the second NOT gate NOT2, maintains logic high as it is.

If the counter pulse changes from logic high to logic low at a falling edge in state in which the sum output SUMo is logic low, the first inversion switch ISWT1 is turned on to reverse the input of logic low so the first node n1 becomes low high, the second node n2 becomes logic high, and the second inversion switch ISWT2 is turned off to maintain the states of the first and second nodes. Also, since the counter pulse, which is the input of the first NAND gate NAND1, is logic low, the output of the first NAND gate NAND1 becomes logic high, and accordingly the internal pulse Pulse_i, which is the output of the second NOT gate NOT2, becomes logic low.

That is, as shown in FIG. 9B, during arising edge occurs and the logic high is maintained in the counter pulse in state in which the sum output SUMo is logic high, the pulse filter outputs the internal pulse Pulse_i of logic high in synchronization with the counter pulse, and outputs the internal pulse Pulse_i of logic low in synchronization with the falling edge of the counter pulse.

On the other hand, if the counter pulse is logic low while the sum output SUMo is logic low, the first inversion switch ISWT1 is turned on, the first node n1 becomes logic high, the second node n2 becomes logic low, and the second inversion switch ISWT2 is turned off which does not change the state of the first node n1. Also, since the counter pulse, which is the input of the first NAND gate NAND1, is logic low, the output of the first NAND gate NAND1 becomes logic high, and accordingly the internal pulse Pulse_i, which is the output of the second NOT gate NOT2, becomes logic low.

If the counter pulse changes from logic low to logic high in state in which the sum output SUMo is logic low, the first inversion switch ISWT1 is turned off, the first and second nodes n1 and n2 respectively maintain logic high and logic low which are their previous states, and the second inversion switch ISWT2 is turned on to latch the states of the first and second nodes n1 and n2. Also, since the counter pulse, which is the input of the first NAND gate NAND1, is logic high, the output of the first NAND gate NAND1 maintains logic high which is opposite to the second node n2, and accordingly the internal pulse Pulse_i, which is the output of the second NOT gate NOT2, becomes logic low.

In other words, as shown in FIG. 9C, in state in which the sum output SUMo is logic low, even though a rising edge occurs in the counter pulse, the pulse filter does not synchronize with the counter pulse and outputs the internal pulse Pulse_i which maintains logic low as it is.

The bit counter of the $0^{th}$ bit position which is the lowest bit generates the internal pulse Pulse_i which is synchronized with the counter pulse, the bit counter of the first bit position generates the internal pulse Pulse_i in which a pulse once occurs every two counter pulses, and the bit counter of the second bit position generates the internal pulse Pulse_i in which a pulse once occurs every four counter pulses. Similarly, the bit counter of the kth bit position generates the internal pulse Pulse_i in which a pulse once occurs every $2^k$ counter pulses.

Figure 10A:
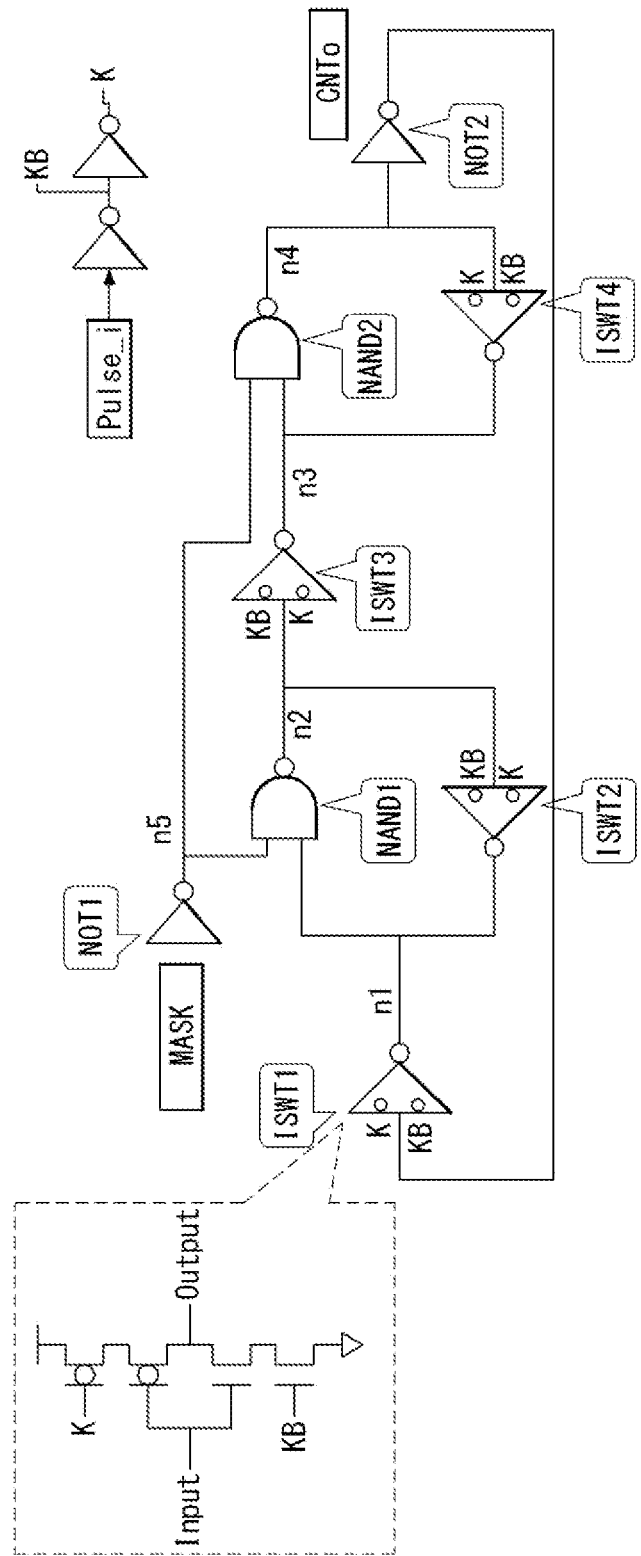
Figure 10B:
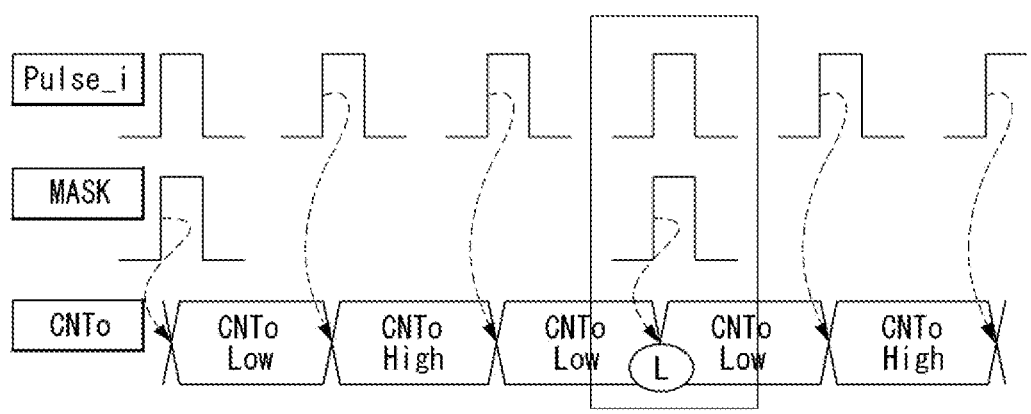

FIGS. 10A and 10B show the specific configuration and operation of the shift register constituting the bit counter of FIG. 8.

The shift register receives the internal pulse Pulse_i which is the output of the register filter and outputs the count value CNTo. The shift register toggles the count value CNTo from 0 to 1 or 1 to 0 in synchronization with the edge of the internal pulse Pulse_i.

The input internal pulse Pulse_i becomes the K signal of the same phase and the KB signal of the opposite phase by two NOT gates.

The shift register may comprise the first NOT gate NOT1 which inverts a mask signal MASK to output the inverted mask signal, the first inversion switch ISWT1 which receives a count value CNTo as an input in a feedback manner, the first NAND gate NAND1 which receives the output of the first inversion switch and the inverted mask signal, the second inversion switch ISWT2 which is connected in parallel with the first NAND gate in state in which their inputs and and outputs are engaged with each other; the third inversion switch ISWT3 which receives the output of the first NAND gate, the second NAND gate NAND2 which receives the output of the third inversion switch and the inverted mask signal, the fourth inversion switch ISWT4 which is connected in parallel with the second NAND gate in state in which their inputs and and outputs are engaged with each other, and the second NOT gate NOT2 which inverts the output of the second NAND gate to output the count value CNTo.

The first and fourth inversion switches ISWT1 and ISWT4 receive K and KB as first and second control signals, and the second and third inversion switches ISWT2 and ISWT3 receive KB and K as first and second control signals.

The first NAND gate NAND1 and the second inversion switch ISWT2 form a first latch, and the second NAND gate NAND2 and the fourth inversion switch ISWT4 form a second latch.

If the mask signal is logic high, the count value CNTO is unconditionally reset through the first NOT gate, the second NAND gate and the second NOT gate irrespective of the internal pulse Pulse_i. The following description relates to a case in which the mask signal MASK is logic low, and the fifth node n5 that is the output of the first NOT gate is logic high.

If the internal pulse Pulse_i is logic low in a state in which the count value CNTo is logic low, K is logic low and KB is logic high. The first inversion switch is turned on to invert the input so that the first node n1, which is the output terminal, becomes logic high. Since both inputs of the first NAND gate are logic high, the second node n2 becomes logic low, and the second inversion switch is turned off to maintain the states of the first node and the second node.

The third inversion switch is also turned off like the second inversion switch, so the third node n3 is floated to maintain the third node n3, the fourth node n4, and the count value CNTo as their previous values. The fourth node n4 is logic high and the third node n3 is logic low.

When a rising edge occurs in the internal pulse Pulse_i to change the internal pulse from logic low to logic high in a state where the count value CNTo is logic low, K and KB become logic high and logic low, respectively. The first inversion switch is turned off so that the first node n1 maintains the previous state of logic high, the second node n2 maintains logic low since both inputs of the first NAND gate are logic high, and the second inversion switch is turned on to latch the states of the first and second nodes.

The third inversion switch is also turned on, like the second inversion switch, to change the third node n3 to logic high, the fourth node becomes logic low by the second NAND gate, the fourth inversion switch is turned off so cannot change the state of the third node, and the count value CNTo becomes logic high by the second NOT gate.

Similarly, when a rising edge occurs in the internal pulse Pulse_i in a state in which the count value CNTo is logic high, the count value CNTo changes from logic high to logic low.

That is, as shown in FIG. 10B, the count value CNTo is toggled from logic high to logic low or from logic low to logic high by the rising edge of the internal pulse Pulse_i.

Figure 11A:
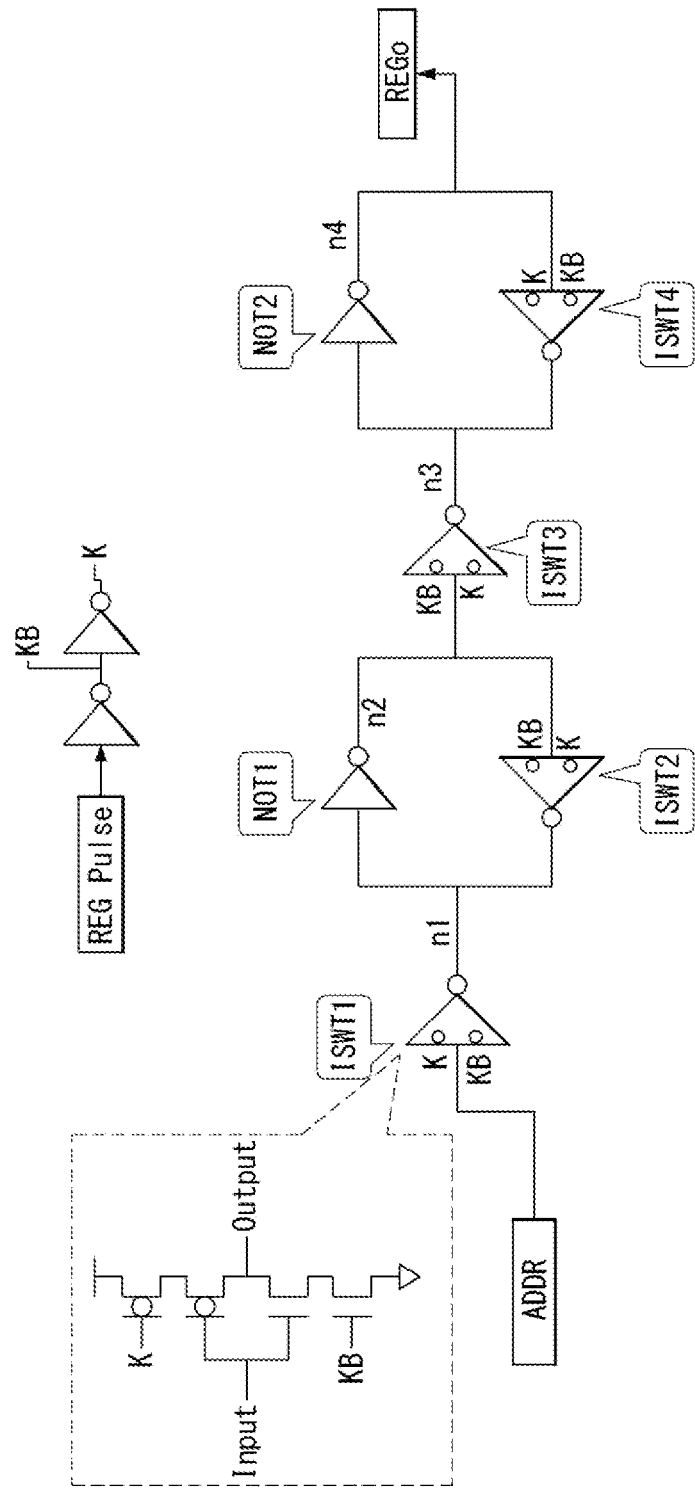
Figure 11B:
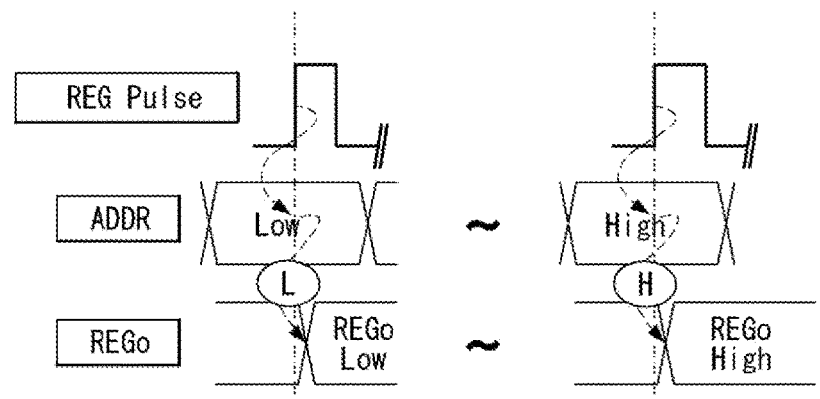

FIGS. 11A and 11B show the specific configuration and operation of the register constituting the bit counter of FIG. 8.

The register sets the start address ADDR to the register output REGo in synchronization with the register pulse (REG Pulse).

The register pulse is generated only once in synchronization with the operation clock CLK when a command starts, and is not generated until the command ends thereafter. The input register pulse becomes a K signal of the same phase and a KB signal of the opposite phase by two NOT gates.

The register may comprise the first inversion switch ISWT1 which receives the start address ADDR, the first NOT gate NOT1 which inverts the output of the first inversion switch, the second inversion switch ISWT2 which is connected connected in parallel with the first NOT gate in a state in which their inputs and and outputs are engaged with each other, the third inversion switch ISWT3 which receives the output of the first Not gate, the second NOT gate NOT2 which receives the output of the third inversion switch, and the fourth inversion switch ISWT4 which is connected in parallel with the second NOT gate in a state in which their inputs and and outputs are engaged with each other.

The first and fourth inversion switches ISWT1 and ISWT4 receive K and KB as first and second control signals, and the second and third inversion switches ISWT2 and ISWT3 receive KB and K as first and second control signals.

The first NOT gate NOT1 and the second inversion switch ISWT2 form a first latch, and the second NOT gate NOT2 and the fourth inversion switch ISWT4 form a second latch.

If the register pulse (REG Pulse) is logic low in a state where the initial address ADDR is logic low, K is logic low and KB is logic high. The first inversion switch is turned on to invert the input, so that the first node n1, which is the output terminal, becomes logic high, the second node n2 becomes logic low by the first NOT gate, and the second inversion switch is off to maintain the states of the first node and the second node. The third inversion switch is also turned off like the second inversion switch, and the third node n3 floats, so that the third node n3, the fourth node n4, and the register output REGo maintain their previous values.

When a rising edge occurs in the register pulse to change the register pulse from logic low to logic high in a state where the initial address ADDR is logic low, K and KB become logic high and logic low, respectively. The first inversion switch is turned off so that the first node n1 maintains the previous state of logic high, the second node n2 maintains logic low by the first NOT gate, and the second inversion switch is turned on to latch the states of the first and second nodes.

The third inversion switch is also turned on, like the second inversion switch, to change the third node n3 to logic high, the fourth node becomes logic low by the second NOT gate, and the fourth inversion switch is turned off so cannot change the state of the third node.

That is, as shown in FIG. 11B, the register output REGo is set to logic low that is the value of the initial address ADDR by the rising edge of the register pulse.

Even if a falling edge occurs in the register pulse to change the register pulse from logic high to logic low in a state where the initial address ADDR is logic low, the third inversion switch is turned off and the register output REGo of the fourth node does not change.

If the register pulse is logic low in a state where the initial address ADDR is logic high, K and KB become logic low and logic high, respectively. The first inverting switch is turned on to invert the input so that the first node n1, which is the output terminal, becomes logic low, the second node n2 becomes logic high by the first NOT gate, and the second inversion switch is turned off to maintain the states of the first node and the second node. The third inversion switch is also turned off like the second inversion switch and the third node n3 floats, so that the third node n3, the fourth node n4, and the register output REGo maintain their previous values.

When a rising edge occurs in the register pulse to change the register pulse from logic low to logic high in a state where the initial address ADDR is logic high, K and KB become logic high and logic low, respectively. The first inversion switch is turned off so that the first node n1 maintains the previous state of logic low, the second node n2 maintains logic high by the first NOT gate, and the second inversion switch is turned on to latch the states of the first and second nodes.

The third inversion switch is also turned on, like the second inversion switch, to change the third node n3 to logic low, the fourth node becomes logic high by the second NOT gate, the fourth inversion switch is turned off so cannot change the state of the third node.

That is, as shown in FIG. 11B, the register output REGo is set to logic high which is the value of the initial address ADDR by the rising edge of the register pulse.

Even if a falling edge occurs in the register pulse to change the register pulse from logic high to logic low in a state where the initial address ADDR is logic high, the third inversion switch is turned off and the register output REGo of the fourth node does not change.

Figure 12:
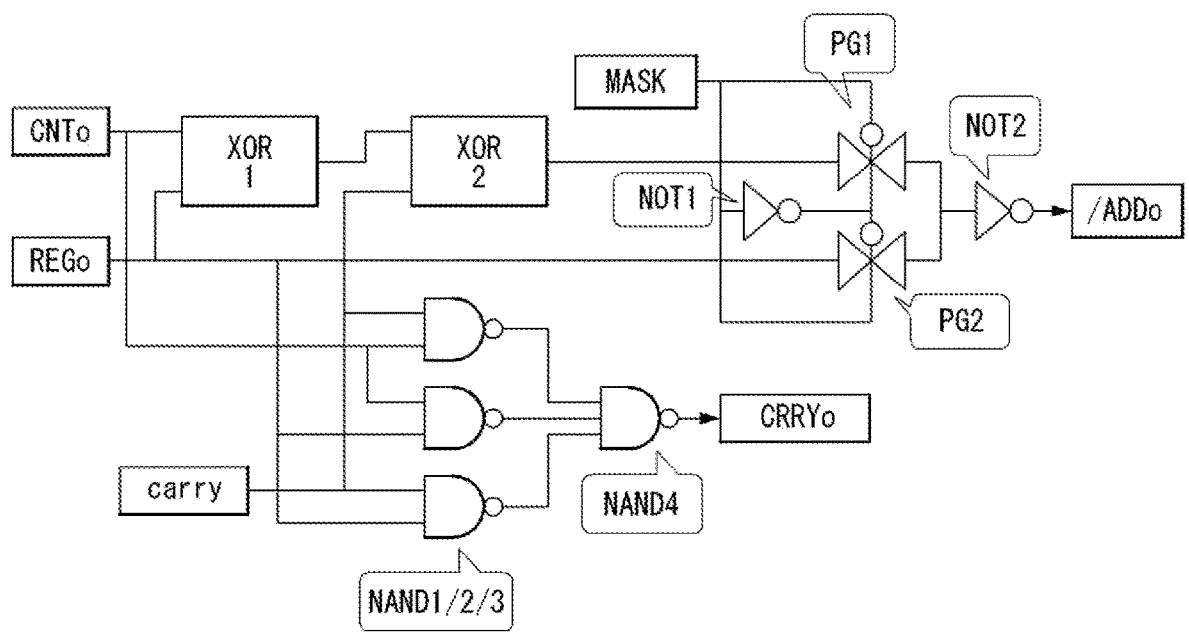
FIG. 12 shows the specific configuration of the adder constituting the bit counter of FIG. 8.

FIG. 12 shows the specific configuration of the adder constituting the bit counter of FIG. 8.

The adder generates the carry output signal CRRYo and the address output signal ADDo using the count output CNTo, the register output REGo, and the carry. When the mask signal MASK is input as logic high, the register output REGo of the register is output as the address output ADDo.

The adder may include an address generator and a carry generator. The address generator may include first/second XOR gates XOR1/XOR2, first/second NOT gates NOT1/NOT2, and first/second pass gates PG1/PG2, and the carry generator may includes four NAND gates NAND1/2/3/4.

In the address generator, the count output CNTo and the register output REGo are input to the first XOR gate XOR1, the output of the first XOR gate and the carry signal are input to the second XOR gate XOR2, the output of the second XOR gate is connected to the first pass gate PG1, the register output REGo is connected to the second pass gate PG2, the outputs of the first/second pass gates is input to the second NOT gate NOT2, and the output of the second NOT gate becomes an inverted address output/ADDo.

The mask signal MASK and the inverted mask signal inverted by the first NOT gate NOT1 become first and second selection signals of the second pass gate, respectively, and the inverted mask signal and the mask signal respectively becomes first and second selection signals of the first pass gate.

When the mask signal is logic high, the second pass gate is selected so that the output of the register output REGo becomes an inverted address output/ADDo through the second NOT gate, and when the mask signal is logic low, the first pass gate is selected so that the output of the second XOR gate becomes the inverted address output/ADDo through the second NOT gate.

The second XOR gate outputs logic high when only one or all three of the count output CNTo, the register output REGo and the carry is logic high, and outputs logic low in other cases.

Accordingly, when the mask signal is logic low, the address output ADDo becomes logic high when only one or all three of the count output CNTo, the register output REGo, and the carry are logic high, and the address output ADDo becomes logic low in other cases.

In the carry generator, one of the first/second/third NAND gates NAND1/2/3 receives the count output CNTo and the register output REGo as inputs, another receives the register output REGo and the carry as inputs, and the other receives the carry and the count output CNTo as inputs. Each output of the first/second/third NAND gates becomes the input of the fourth NAND gate NAND4, and the output of the fourth NAND gate becomes the carry output CRRYo.

The carry output (CRRYo) becomes logic high when two or more of the count output CNTo, the register output REGo and the carry are logic high, and becomes logic low in other cases, that is, when only one is logic high or all are logic low of the count output CNTo, the register output REGo and the carry.

The adder may operate until the mask signal MASK first outputs logic high, and then stop the operation.

The integrated counter of this disclosure outputs a count value and an address value by integrating a latency counter, a burst counter, and an address counter into one. The timing at which a count operation is performed is synchronized with the falling edge of the operation clock (or main clock). The operation of the address counter is performed by adding the count value and the start address stored in the register.

The integrated counter generates a mask signal if the count value equals the burst length, and also generates the mask signal even if the count value equals the latency length. The integrated counter first compares the count value with the burst length to generate a first mask signal when they are equal, then resets the count value, then compares the count value with the latency length again to generate a second mask signal when they are equal, and terminates the operation requested by the host.

The shift register included in the integrated counter may give priority to the mask signal and initialize the internal count value when the mask signal and the counter pulse for increasing the count value occur at the same time.

Accordingly, the number of counters is reduced, the circuit size can be reduced, power consumption can be reduced, and the counter control becomes easier, thereby increasing the data input/output speed.

INDUSTRIAL APPLICABILITY

Hereinabove, the preferred embodiments of the present disclosure are disclosed for an illustrative purpose and hereinafter, modifications, changes, substitutions, or additions of various other embodiments will be made within the technical spirit and the technical scope of the present disclosure disclosed in the appended claims by those skilled in the art.

The invention claimed is:
1. A memory device comprising:
  a memory cell array in which memory cells are connected to word lines and bit lines in a matrix form; and
  a control circuit configured to control an operation of programming or reading the memory cells according to a start address, a burst length, a latency length and a program or reading instruction transmitted from a host, wherein the control circuit comprises:

a pulse generator configured to a register pulse and a counter pulse in synchronization with an operation clock; and a counter configured to set the start address in synchronization with the register pulse, increase a count value until the burst length, then reset the count value, and increase the count value until the latency length again in synchronization with the counter pulse, and increase an address by adding the count value to the start address while counting a number of counter pulses corresponding to the burst length, wherein the pulse generator is configured to generate the register pulse in synchronization with a rising edge of the operation clock, and generate the counter pulse in synchronization with a falling edge of the operation clock.

2. The memory device of claim 1, wherein the counter comprises:

a number of bit counters corresponding to a number of bits constituting the address; and a mask generator configured to compare the count value output from the bit counters with the burst length and the latency length for each counter pulse, and generate a mask signal which resets the bit counters when the count value matches the burst length or the latency length.

3. The memory device of claim 2, wherein each bit counter is configured to:

toggle an internal count value whenever a number of counter pulses corresponding to a corresponding bit position are input, generate a value of the corresponding bit position of the address and a carry output signal based on the internal count value of a corresponding bit counter, a value of the corresponding bit position of the start address stored in the corresponding bit counter, a carry signal transmitted from a bit counter of a lower bit position, and initialize the internal count value responding to the mask signal.

4. The memory device of claim 2, wherein the mask generator is configured to generate the mask signal to output to the bit counters when the count value becomes the burst length, and then generate the mask signal to output to the bit counters when the count value becomes the latency length.

5. The memory device of claim 3, wherein the bit counter comprises:

a sum signal generator configured to output a sum signal of a corresponding bit by performing AND logic processing on a sum signal output by the bit counter of a lower bit and an internal count value;

a pulse filter configured to generate an internal counter pulse synchronized with the counter pulse on condition that the sum signal output by the sum signal generator is logic high;

a shift register configured to output the internal count value by toggling the internal count value in synchronization with the internal counter pulse and reset the internal count value responding to the mask signal;

a register configured to store a value of a corresponding bit of the start address in synchronization with the register pulse and output the stored value as a register value; and an adder configured to generate the carry output signal and an address output signal by using the internal count value, the register value, and the carry signal output by the bit counter of the lower bit.

6. The memory device of claim 5, wherein the pulse filter is configured to output a pulse equal to the counter pulse as the internal counter pulse when a rising edge occurs on the counter pulse while the sum signal is logic high, and output logic low when a rising edge occurs on the counter pulse while the sum signal is logic low.

7. The memory device of claim 5, wherein the shift register is configured to reset the internal count value according to the mask signal when the internal counter pulse coincides with the mask signal.

8. The memory device of claim 5, wherein the adder is configured to generate the address output signal as logic high when only one of the internal count value, the register value and the carry signal output by the bit counter of the lower bit is logic high or all of them are logic high, and output the carry output signal as logic high when two or more of the internal count value, the register value and the carry signal output by the bit counter of the lower bit are logic high.

9. The memory device of claim 8, wherein the adder comprises:

an address generator including a first XOR gate performing XOR logic processing on two of the internal count value, the register value and the carry signal output by the bit counter of the lower bit and a second XOR gate performing XOR logic processing on a remainder of the internal count value, the register value and the carry signal output by the bit counter of the lower bit and an output of the first XOR gate; and a carry generator including first, second and third NAND gates each of which performs NAND logic processing on one of three combinations each of which comprises two of the internal count value, the register value and the carry signal output by the bit counter of the lower bit, and a fourth NAND gate performing NAND logic processing on outputs of the first, second and third NAND gates.

* * * * *